(12) United States Patent
Verbeck

(10) Patent No.: US 6,442,091 B2
(45) Date of Patent: Aug. 27, 2002

(54) SENSE AMPLIFIER

(75) Inventor: Michael Verbeck, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/833,052

(22) Filed: Apr. 11, 2001

(30) Foreign Application Priority Data

Apr. 11, 2000 (DE) .......................................... 100 17 921

(51) Int. Cl.$^7$ ................................................. G11C 7/06
(52) U.S. Cl. .................. 365/208; 365/207; 365/185.21; 327/53; 327/56
(58) Field of Search .............................. 365/205, 207, 365/208, 185.21; 327/51, 52, 53, 56

(56) References Cited

U.S. PATENT DOCUMENTS 5,355,333 A   10/1994  Pascucci ................ 365/189.01
6,041,012 A * 3/2000  Banba et al. .......... 365/185.18
6,104,659 A * 8/2000  Yagishita et al. ........... 365/226

FOREIGN PATENT DOCUMENTS

EP   0 491 105 A1   6/1992
EP   0 872 850 A1   10/1998

* cited by examiner

*Primary Examiner*—Son Mai
(74) *Attorney, Agent, or Firm*—Laurence A. Greenberg; Werner H. Stemer; Ralph E. Locher

(57) ABSTRACT

The sense amplifier compares an input signal characterizing the content of the memory device which is to be read with a threshold value which can be changed or selected on the basis of the output signal from the sense amplifier. The use of such a sense amplifier makes it possible to reduce the risk of the content of a memory device which is to be read being determined incorrectly to a minimum.

22 Claims, 2 Drawing Sheets

SENSE AMPLIFIER

BACKGROUND OF THE INVENTION

Field of the Invention

The present invention relates to a sense amplifier for ascertaining the content of a memory device which is to be read. The content of the memory device is ascertained by comparing a current or voltage which is supplied to the sense amplifier as an input signal characterizing the content of the memory device and a threshold value.

Such sense amplifiers are used, for example, for reading data stored in a semiconductor memory (for example in an EEPROM), more precisely in the memory cells thereof.

When a memory cell in a semiconductor memory is read, a current or voltage is produced whose size is dependent on the content of the memory cell which is to be read, as is known. The sense amplifier compares this current or this voltage with a threshold value and determines the content of the memory cell which is to be read on the basis of the result of this comparison.

Experience shows that, with higher or lower frequency, sense amplifiers ascertain the content of a memory device which is to be read, such as a memory cell in a semiconductor memory, incorrectly.

Such errors can be prevented, in some cases, if the threshold value is stipulated such that it lies exactly in the center of the currents or voltages which are established on the basis of the content of a memory cell when the memory cell is read. However, even this does not provide a reliable way of ensuring that the sense amplifier always ascertains the content of the memory cell correctly.

SUMMARY OF THE INVENTION

The object of the present invention is to provide a sense amplifier which overcomes the above-noted deficiencies and disadvantages of the prior art devices and methods of this general kind, and in which the risk that the content of a memory device is determined incorrectly can be reduced to a minimum.

With the above and other objects in view there is provided, in accordance with the invention, a sense amplifier for ascertaining a memory content of a memory device, comprising:

an input receiving an input signal characterizing a content of a memory device in a first memory state or profile and in a second memory state or profile, and an output carrying an output signal representing the content of the memory device;

a comparator device for comparing a current or a voltage of the input signal with a threshold value and determining therefrom a memory content of the memory device;

wherein the threshold value is defined as a first threshold value to be exceeded or undershot by the input signal in order for the output signal representing the content of the memory device to change from the first state or profile to the second state or profile, and as a second threshold value, higher or lower than the first threshold value, to be exceeded or undershot by the input signal in order for the output signal to change from the second state or profile to the first state or profile.

In other words, the sense amplifier according to the invention is distinguished in that the threshold value which the sense amplifier's input signal characterizing the content of the memory device needs to exceed or fall below in order for an output signal from the sense amplifier, which represents the content of the memory device, to change from a state or profile which represents a first memory device content to a state or profile which represents a second memory device content is higher or lower than the threshold value which the sense amplifier's input signal characterizing the content of the memory device needs to exceed or fall below in order for the output signal from the sense amplifier to change from a state or profile which represents the second memory device content to a state or profile which represents the first memory device content.

This makes it possible to prevent the states which are established in the sense amplifier, and hence possibly also the output signal from the sense amplifier, from repeatedly changing while the memory device (for example a memory cell in a semiconductor memory) is being read.

The states established in the sense amplifier and the output signal from the sense amplifier change repeatedly, in particular, when switching operations taking place within or outside the sense amplifier cause changes in the supply voltage and/or produce interference signals which affect the operation of the sense amplifier and/or the size of the currents or voltages which are to be compared by said sense amplifier. This can cause the sense amplifier and/or the output signal from the sense amplifier to begin to oscillate to the full. This is particularly the case when the various currents or voltages produced when a memory device is read are relatively close to one another.

A suitable choice of the various threshold values which the signal which is input into the sense amplifier needs to exceed or fall below in order for the output signal from the sense amplifier to jump from the low level to the high level or from the high level to the low level makes it possible to prevent the aforementioned interference from being able to cause any change in the states which are established in the sense amplifier and/or in the output signal.

Since sense amplifiers, like any other circuits, are generally designed from the outset such that the interfering influence of switching operations or other events on the currents and voltages produced within and outside the circuit is relatively slight, a relatively slight difference between the various threshold values is sufficient to prevent the effects which are based on such interference. This ensures that there is a sufficiently great distance between the threshold values and the currents or voltages which are to be compared with these threshold values, so that the use of the various threshold values has no negative influence on ascertainment of the actual memory cell content.

The sense amplifier according to the invention thus makes it possible to reduce the risk of the content of a memory device being determined incorrectly to a minimum.

In accordance with an added feature of the invention, the threshold value used for the comparison is selected or stipulated on the basis of the respective state or profile of the output signal from the sense amplifier.

In accordance with an additional feature of the invention, the output signal indicates whether the input signal characterizing the content of the memory device lies below or above the threshold value used before the output signal last changed over.

In accordance with another feature of the invention, the threshold value used when the output signal represents the first memory device content is closer to the input signal established when the content of the memory device is the second memory device content than the threshold value used when the output signal represents the second memory device content.

In accordance with a further feature of the invention, the memory device is a memory cell in a semiconductor memory.

In accordance with again an added feature of the invention, there is provided a differential amplifier having a first input receiving a voltage characterizing the content of the memory device and a second input receiving a reference voltage.

In accordance with again an additional feature of the invention, the differential amplifier is configured to compare the voltages at the first and second inputs, but the comparison is specifically perturbed by an offset voltage. The offset signal, which is generated in the differential amplifier, corresponds to an offset voltage or acts as an offset voltage. Preferably, the offset voltage is a variable voltage. The offset voltage is variable in magnitude and/or in its arithmetic sign.

In accordance with again an additional feature of the invention, the magnitude and/or arithmetic sign of the offset voltage is changed based on an output signal of the differential amplifier.

In accordance with again another feature of the invention, an output signal of the differential amplifier indicates whether the voltage characterizing the content of the memory device is higher than a first threshold voltage or lower than a second threshold voltage, which is lower than the first threshold voltage. Preferably, the first threshold voltage is higher than the reference voltage. Similarly, the second threshold voltage is lower than the reference voltage.

In accordance with again a further feature of the invention, a difference between the first threshold voltage and the reference voltage and/or a difference between the second threshold voltage and the reference voltage is/are dependent on the offset voltage produced in the differential amplifier that corresponds to an offset voltage or acting as an offset voltage.

In accordance with yet an added feature of the invention, the offset voltage is produced by impressing an additional current into the differential amplifier. In a preferred embodiment, a current control stage is provided to output the additional current based on the output signal from the sense amplifier.

In accordance with yet an additional feature of the invention, the current control stage impresses the additional current at a point of the differential amplifier which is dependent on the output signal of the sense amplifier.

In accordance with yet another feature of the invention, the voltage produced in the differential amplifier and corresponding to an offset voltage or acting as an offset voltage is a voltage dropping across a resistance (a resistor or a circuit component acting as a resistor) in the differential amplifier, with a flow of current through the resistance that produces the voltage drop dependent on the additional current impressed into the differential amplifier. A direction of the current flowing through the resistance is dependent on a point at which the current is impressed into the differential amplifier.

In accordance with yet again an added feature of the invention, one of the voltages supplied to the differential amplifier via the inputs is varied on a basis of the output signal of the differential amplifier.

In accordance with a concomitant feature of the invention, a supply voltage for the differential amplifier is varied on the basis of the output signal of the differential amplifier.

Other features which are considered as characteristic for the invention are set forth in the appended claims.

Although the invention is illustrated and described herein as embodied in a sense amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The sense amplifier described herein is a component part of an integrated circuit. In the exemplary embodiment, this integrated circuit is a non-volatile memory, for example an EEPROM chip. Before continuing, however, it should be pointed out that there is no limitation to this. A sense amplifier having the special features described below may also be used as a sense amplifier for any other memories whose content can be ascertained on the basis of the size of a current or voltage which is established during reading. Furthermore, the sense amplifier need not be a component part of a memory chip; it may also be a component part of any other integrated circuit (for example of a microcontroller having an internal memory), and may also be in the form of a "normal"(non-integrated) circuit.

To clarify the differences and commonalties between conventional sense amplifiers and the sense amplifier considered in the present case, the design and operation of a sense amplifier and the arrangement thereof in a system containing it is now first described with reference to FIGS. 1 to 3.

The conventional sense amplifier under consideration compares a voltage established when the memory cell whose content is to be ascertained by the sense amplifier is read with a reference voltage.

The voltage which is to be compared with the reference voltage is dependent on the 'cell current' which flows, on the 'bit line', into or out of the memory cell which is to be read.

The size of this cell current is dependent on the content of the memory cell which is to be read.

Figure 1:
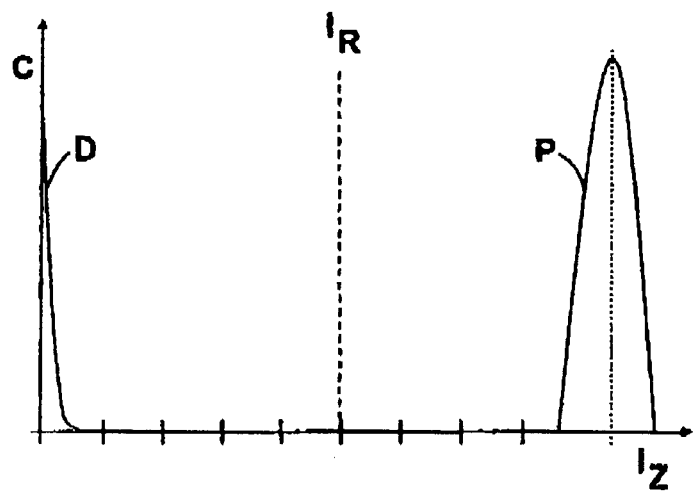
FIG. 1 is a graph showing the (cell) currents which flow, when memory cells in a semiconductor memory are read, into or out of the memory cells on the basis of their contents.

Referring now to the figures of the drawing in detail and first, particularly, to FIG. 1 thereof, there is shown the size of the cell current in the memory cells of a memory when the memory cells in question have been erased and when the memory cells in question have been programmed. In this case, $I_z$ denotes the cell current which is established when the memory cells are read, C denotes the number of cells whose reading involves the respective cell current $I_z$ being established, D denotes the conditions when the memory cells have been erased, and P denotes the conditions when the memory cells have been programmed.

The reference voltage supplied to the sense amplifier is based on a reference current produced by a reference current source.

Figure 2:
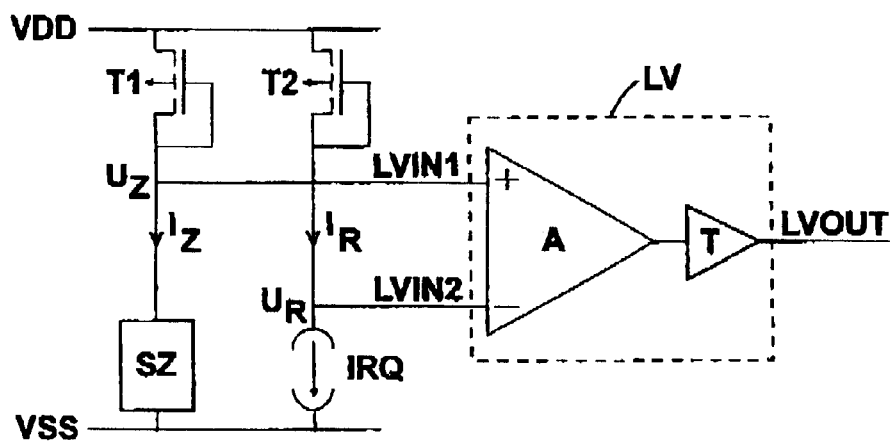
FIG. 2 is a schematic diagram of the basic design of a sense amplifier and its arrangement in a system containing the sense amplifier.

The basic design of the sense amplifier and the arrangement thereof in a system containing it is shown in FIG. 2.

The arrangement shown in FIG. 2 contains a sense amplifier LV, a memory cell SZ which is to be read using the sense amplifier, a reference current source IRQ, and PMOS transistors T1 and T2 connected in series with the memory cell SZ and the reference current source IRQ; the sense amplifier contains a differential amplifier A and an output driver T, connected downstream thereof.

When the memory cell SZ is read, the aforementioned cell current $I_z$ flows via that circuit path of the arrangement shown in FIG. 2 which contains the memory cell. The reference current source IRQ produces a reference current IR which flows via the circuit path containing the reference current source. The transistors T1 and T2 (acting as diodes) are used for current/voltage conversion and make it possible for a voltage $U_z$ which is dependent on the cell current $I_z$ to be tapped off between the memory cell SZ and the transistor t1, and for a (reference) voltage $U_R$ which is dependent on the reference current $I_R$ to be tapped off between the reference current source IRQ and the transistor T2.

The sense amplifier LV has a first input connection LVIN1, a second input connection LVIN2 and an output connection LVOUT, where the first input connection LVIN1 has the voltage $U_z$ applied to it, the second input connection LVIN2 has the voltage $U_R$ applied to it, and the output connection LVOUT outputs a signal which represents the content of the memory cell which is to be read.

The differential amplifier A contained in the sense amplifier likewise has two input connections and an output connection, where the first input connection of the differential amplifier coincides with the first input connection LVIN1 of the sense amplifier, that is to say has the voltage $U_z$ applied to it, the second input connection of the differential amplifier coincides with the second input connection LVIN2 of the sense amplifier, that is to say has the voltage $U_R$ applied to it, and the signal output from the output connection denoted by the reference symbol O indicates whether $U_z$ is higher or lower than $U_R$.

Figure 3:
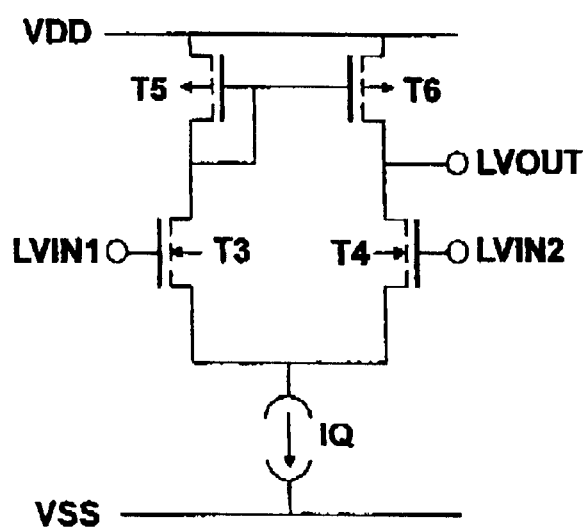
FIG. 3 is a schematic diagram showing the layout of a differential amplifier in a conventional sense amplifier.

The design of the differential amplifier A of the conventional sense amplifier LV under consideration is illustrated in FIG. 3.

The differential amplifier has a current source IQ supplying a current 2*I, NMOS transistors T3 and T4, and PMOS transistors T5 and T6, the transistors T3 and T5 and the transistors T4 and T6 being provided in circuit paths which are connected in parallel with one another and in series with the current source IQ, and being connected in series within these circuit paths.

The transistor T3 is driven by one of the voltages which are to be compared with one another, more precisely by the voltage $U_z$; the gate connection of the transistor T3 is connected to the first input connection LVIN1 of the sense amplifier LV. The voltage $U_z$ applied to the gate connection of the transistor T3 turns on that transistor to a greater or lesser extent, as a result of which a current which is dependent on the voltage $U_z$ flows in the circuit path containing the transistors T3 and T5. The transistor T5 is connected to the transistor T6 to form a current mirror which permits the same current to flow through the circuit path containing the transistors T4 and T6 as through the circuit path containing the transistors T3 and T5. The current which actually flows in the circuit path containing the transistors T4 and T6 is dependent on the state of the transistor T4. This transistor T4 is driven by the second of the voltages which are to be compared with one another, i.e. by the voltage $U_R$; the gate connection of the transistor T4 is connected to the second input connection LVIN2 of the sense amplifier A. A voltage is established between the transistors T4 and T6 which is dependent on the ratio of the resistors formed by the transistors T4 and T6. This voltage is tapped off and is output from the differential amplifier A as the comparison result which is to be ascertained thereby; the tap point is connected to the output connection O of the differential amplifier.

The voltage output from the differential amplifier A is supplied to the output driver T. This converts the voltage obtained from the differential amplifier A into a voltage representing the level 0 or the level 1, according to the arithmetic sign and/or size of the voltage so obtained, and outputs this voltage from the sense amplifier LV, more precisely from its output terminal LVOUT.

The reference current $I_R$ produced by the reference current source IRQ is preferably exactly in the center between the cell current $I_z$ which is established when the memory cell which is to be read has been erased and the cell current $I_z$ which is established when the memory cell in question has been programmed (see FIG. 1). A similar situation applies for the voltages $U_R$ and $U_z$ based on the currents $I_R$ and $I_z$. This means that it is possible to read off from the voltage output from the differential amplifier A or from the sense amplifier LV whether the memory cell which is to be read has been erased or programmed.

In comparison with such a conventional sense amplifier, the sense amplifier under consideration in the present case is distinguished in that the threshold value which the sense amplifier's input signal characterizing the content of the memory device needs to exceed or fall below in order for an output signal from the sense amplifier, which represents the content of the memory device, to change from a state or profile which represents a first memory device content to a state or profile which represents a second memory device content is higher or lower than the threshold value which the sense amplifier's input signal characterizing the content of the memory device needs to exceed or fall below in order for the output signal from the sense amplifier to change from a state or profile which represents the second memory device content to a state or profile which represents the first memory device content.

In the exemplary embodiment, the threshold value used for the comparison is selected or stipulated on the basis of the respective state or profile of the output signal from the sense amplifier.

In the present case, the threshold value used when the sense amplifier's output signal, representing the content of the memory device, represents the first memory device content is closer to the sense amplifier's input signal established when the content of the memory device is the second memory device content than the threshold value used when the sense amplifier's output signal, representing the content of the memory device, represents the second memory device content.

Figure 4:
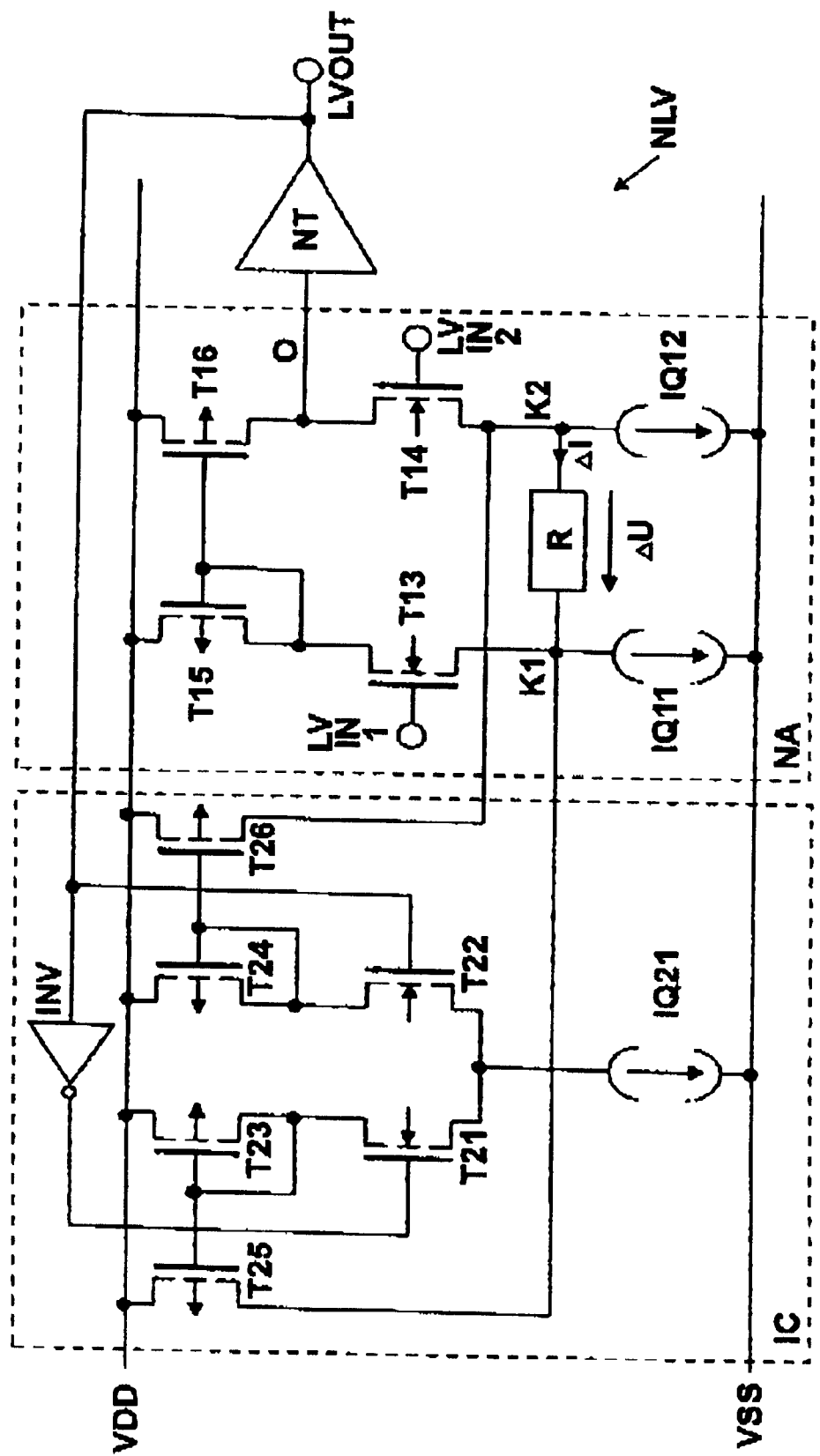
FIG. 4 is a schematic showing the configuration of the sense amplifier described in more detail below.

An exemplary embodiment of such a sense amplifier is illustrated in FIG. 4.

The sense amplifier under consideration is denoted by the reference symbol NLV; it contains a differential amplifier NA and an output driver NT, connected downstream thereof.

Like the conventional sense amplifier LV described, the sense amplifier NLV has a first input connection LVIN1, a second input connection LVIN2, and an output connection LVOUT and is designed to be integrated into a system containing it in exactly the same way as is the case for the conventional sense amplifier described above, as shown by way of example in FIG. 2.

This means that the first input connection LVIN1 has a voltage characterizing the content of the memory cell, that is to say the voltage $U_z$, applied to it, the second input connection LVIN2 has a reference voltage, that is to say the voltage $U_R$, applied to it, and the output connection LVOUT outputs a signal which represents the content of the memory cell which is to be read.

The differential amplifier NA contained in the sense amplifier likewise has two input connections and an output connection, where the first input connection of the differential amplifier NA coincides with the first input connection LVIN1 of the sense amplifier, that is to say has the voltage $U_z$ applied to it, the second input connection of the differential amplifier NA coincides with the second input connection LVIN2 of the sense amplifier, that is to say has the voltage $U_R$ applied to it, and the signal output from the output connection denoted by the reference symbol O indicates whether $U_z$ is higher than $U_R + \Delta U$ or lower than $U_R - \Delta U$.

The differential amplifier NA contains a comparison part VT and a current control stage IC.

The comparison part VT respectively contains current sources IQ11 and IQ12 supplying a current $I + \Delta I$, NMOS transistors T13 and T14, PMOS transistors T15 and T16, and a resistor R, where the first current source IQ11, the first NMOS transistor T13 and the first PMOS transistor 15 are connected in series, the second current source IQ12, the second NMOS transistor T14 and the second PMOS transistor 16 are connected in series, the circuit path containing the current source IQ11, the NMOS transistor T13 and the PMOS transistor 15 and the circuit path containing the current source IQ12, the NMOS transistor T14 and the PMOS transistor 16 are arranged in parallel with one another and are connected to one another via the resistor R at node points K1 and K2 situated between the current source IQ11 and the transistor T13 and between the current source IQ12 and the transistor T14. The transistor T13 is driven by the voltage $U_z$; the gate connection of the transistor T13 is connected to the first input connection of the differential amplifier NA. The voltage $U_z$ applied to the gate connection of the transistor T13 turns on said transistor to a greater or lesser extent, as a result of which a current which is dependent on the voltage $U_z$ flows in the circuit path containing the transistors T13 and T15. The transistor T15 is connected to the transistor T16 to form a current mirror which permits the same current to flow through the circuit path containing the transistors T14 and T16 as through the circuit path containing the transistors T13 and T15. The current which actually flows in the circuit path containing the transistors T14 and T16 is dependent on the state of the transistor T14. This transistor T14 is driven by the voltage $U_R$; the gate connection of the transistor T14 is connected to the second input connection of the differential amplifier NA. A voltage is established between the transistors T14 and T16 which is dependent on the ratio of the resistors formed by the transistors T14 and T16. This voltage is tapped off and is output from the differential amplifier NA via the output connection O thereof. The signal output from the differential amplifier NA is supplied to the output driver NT. This converts the voltage obtained from the differential amplifier NA into a voltage representing the level 0 or the level 1, according to the arithmetic sign and/or size of said obtained voltage, and outputs this voltage from the sense amplifier NLV, more precisely from the output connection LVOUT thereof.

As has already been mentioned above, the voltage output from the output connection O of the differential amplifier NA and hence also from the output connection LVOUT of the sense amplifier NLV containing the differential amplifier NA does not signal whether $U_z$ is higher or lower than $U_R$, but instead signals whether $U_Z$ is higher than $U_R + \Delta U$ or lower than $U_R - \Delta U$.

In the sense amplifier under consideration in the present case, this is achieved by providing, in contrast to the conventional differential amplifier shown in FIG. 3 and described with reference thereto, two current sources IQ11 and IQ12, in addition, the resistor R, and in addition, the current control stage IC.

The aforementioned $\Delta U$ is the voltage which drops across the resistor R when a current $\Delta I$ flows through it, and is therefore a voltage which corresponds to an offset voltage of the sense amplifier or acts as an offset voltage. The size of $\Delta U$ can be set by the size of the resistor R and by the current $\Delta I$ flowing through the latter. In the exemplary embodiment, these sizes are stipulated such that $U_R + \Delta U$ and $U_R - \Delta U$ are only a little higher than $U_R \cdot U_R + \Delta U$ is still significantly lower than the voltage $U_z$ which is supplied to the sense amplifier when a programmed memory cell is read, and $U_R - \Delta U$ is still significantly higher than the voltage $U_z$ which is supplied to the sense amplifier when an erased memory cell is read. In this context, it should be bore in mind that the voltage $U_z$ which is supplied to the sense amplifier when a memory cell is read changes as the memory device ages: the voltage $U_z$ which is supplied to the sense amplifier when a programmed memory cell is read may become lower as the memory device ages, and the voltage $U_z$ which is supplied to the sense amplifier when an erased memory cell is read may become higher as the memory device ages. The fact that $\Delta U$ is so low means that the sense amplifier can continue to ascertain reliably the content of a memory cell which is to be read. On the other hand, the fact that the sense amplifier no longer compares $U_z$ with $U_R$, but instead with $U_R + \Delta U$ or with $U_R - \Delta U$, means that it is possible to prevent interference-related fluctuations in the supply voltage and/or in $U_z$ and/or $U_R$ from immediately causing a change in the output signal from the sense amplifier; the current control stage IC described in more detail below ensures that, if the sense amplifier's output signal signals that the memory cell read has been programmed, the sense amplifier changes its output signal only if $U_z$ is lower than $U_R - \Delta U$, and that, if the sense amplifier's output signal signals that the memory cell read has been erased, the sense amplifier changes its output signal only if $U_z$ is higher than $U_R + \Delta U$. This is of particular significance when $U_z$ and $U_R$ are relatively close to one another for the aforementioned reasons or for other reasons.

If $U_z$ and $U_R$ are relatively close to one another, the current sources IQ11 and IQ12 each supply a current $I + \Delta I$, a current I flows through each of the circuit paths containing the transistors T13 and T15 and the transistors T14 and T16, the current control stage IC impresses a current $2*\Delta I$ at the node point K1 or at the node point K2, and a current $\Delta I$ flows through the resistor R, with the direction of the flow of current being dependent on whether the current control stage IC impresses a current at the node point Kl or the node point K2.

The current control stage IC, which has already been mentioned a number of times, contains a current source IQ21 supplying a current $2*\Delta I$, NMOS transistors T21 and T22, PMOS transistors T23 to T26 and an inverter INV, where the transistors T21 and T23 and the transistors T22 and T24 are provided in circuit paths which are connected in parallel with one another and in series with the current source IQ21, and are connected in series within these current paths, the transistors T23 and T25 and the transistors T24 and T26 are respectively connected to form a current mirror which causes the currents flowing in the transistors T23 and T24 to flow in the transistors T25 and T26, the gate connection of the transistor T22 is connected to the output connection of the output driver NT, and the gate connection of the transistor T21 is connected to the output connection of the output driver NT via the invertor INV, the drain connection of the transistor T25 is connected to the node point K1 of the comparison part VT, and the drain connection of the transistor T26 is connected to the node point K2 of the comparison part VT.

If and so long as the output signal from the sense amplifier NLV (from the output driver NT thereof) has a high level, the transistor T22 is on and the transistor T21 is off, as a result of which the total current supplied by the current source IQ21, that is to say 2*ΔI, flows through the circuit path containing the transistors T22 and T24. This current is mirrored into the transistor T26 by the current mirror formed by the transistors T24 and T26, so that a current 2*ΔI flows through this transistor T26 as well. This current is impressed into the node point K2 of the comparison part VT. Since the transistor T21 is off at this stage, no current can flow through the transistors T21, T23 and T25, which means that no current is impressed into the node point K1 of the comparison part VT. Impressing a current 2*ΔI into the node point K2 causes a compensating current of ΔI to flow through the resistor R. This flow of current, more precisely the voltage drop ΔU across the resistor R which is established as a result thereof, ensures that the currently high level of the signal which is output from the sense amplifier does not fall to the low level as soon as the voltage $U_z$ applied to the gate connection of the transistor T13 falls below the voltage $U_R$ applied to the gate connection of the transistor T14, but rather only when the voltage $U_z$ applied to the gate connection of the transistor T13 falls below the voltage $U_R - \Delta U$.

If and so long as the output signal from the sense amplifier NLV (from the output driver NT thereof) has a low level, the transistor T21 is on and the transistor T22 is off, as a result of which the total current supplied by the current source IQ21, that is to say 2*ΔI, flows through the circuit path containing the transistors T21 and T23. This current is mirrored into the transistor T25 by the current mirror formed by the transistors T23 and T25, so that a current 2*ΔI flows through this transistor T25 as well. This current is impressed into the node point Kl of the comparison part VT. Since the transistor T22 is off at this stage, no current can flow through the transistors T22, T24 and T26, which means that no current is impressed into the node point K2 of the comparison part VT. Impressing a current 2*ΔI into the node point K1 causes a compensating current of ΔI to flow through the resistor R. This flow of current, more precisely the voltage drop ΔU across the resistor R which is established as a result thereof, ensures that the currently low level of the signal which is output from the sense amplifier does not rise to the high level as soon as the voltage $U_z$ applied to the gate connection of the transistor T13 exceeds the voltage $U_R$ applied to the gate connection of the transistor T14, but rather only when the voltage $U_z$ applied to the gate connection of the transistor T13 exceeds the voltage $U_R + \Delta U$.

A sense amplifier of the design described compares the current or the voltage which is supplied to the sense amplifier as an input signal characterizing the content of the memory cell which is to be read with various threshold values on the basis of the output signal. It compares $U_z$ with $U_R - \Delta U$ if its output signal has a high level, and it compares $U_z$ with $U_R + \Delta U$ if its output signal has a low level.

It ought to be clear that the sense amplifier described can be modified in a wide variety of different ways.

Thus, for example, the resistor R can be replaced with another element or another arrangement across which a voltage drop which is dependent on the current flowing through it is established. Such an arrangement comprises one or more transistors, for example.

In addition, it would also be conceivable to compare the voltage $U_z$ supplied to the sense amplifier with threshold values which are not situated symmetrically with respect to the reference voltage $U_R$, that is to say to use a ΔU for which not only the arithmetic sign but also the magnitude are dependent on the output signal from the sense amplifier.

Naturally, a current control stage IC acting as described may also be implemented in a manner other than that described.

It would also be possible to provide a conventional differential amplifier instead of the differential amplifier described and to supply a reference voltage which is dependent on the output signal from the sense amplifier to said conventional differential amplifier (to supply a low reference voltage if the output signal from the sense amplifier has a high level, and to supply a high reference voltage if the output signal from the sense amplifier has a low level). It would also be conceivable to vary the voltage characterizing the content of the memory cell and/or the supply voltage for the differential amplifier on the basis of the output signal from the differential amplifier.

The use of a sense amplifier operating as described or in a similar manner makes it possible to reduce the risk of the content of a memory device which is to be read being determined incorrectly to a minimum.

I claim:

1. A sense amplifier for ascertaining a memory content of a memory device, comprising:
    an input receiving an input signal characterizing a content of a memory device in a first memory state or profile and in a second memory state or profile, and an output carrying an output signal representing the content of the memory device;
    a comparator device for comparing a current or a voltage of the input signal with a threshold value and determining therefrom a memory content of the memory device;
    wherein the threshold value is defined as a first threshold value to be exceeded or undershot by the input signal in order for the output signal representing the content of the memory device to change from the first state or profile to the second state or profile, and as a second threshold value, higher or lower than the first threshold value, to be exceeded or undershot by the input signal in order for the output signal to change from the second state or profile to the first state or profile.

2. The sense amplifier according to claim 1, wherein the threshold value used for the comparison is selected or stipulated on the basis of the respective state or profile of the output signal from the sense amplifier.

3. The sense amplifier according to claim 1, wherein the output signal indicates whether the input signal characterizing the content of the memory device lies below or above the threshold value used before the output signal last changed over.

4. The sense amplifier according to claim 1, wherein the threshold value used when the output signal represents the first memory device content is closer to the input signal established when the content of the memory device is the second memory device content than the threshold value used when the output signal represents the second memory device content.

5. The sense amplifier according to claim 1, wherein the memory device is a memory cell in a semiconductor memory.

6. The sense amplifier according to claim 1, which comprises a differential amplifier having a first input receiving a voltage characterizing the content of the memory device and a second input receiving a reference voltage.

7. The sense amplifier according to claim 6, wherein the differential amplifier is configured to compare the voltages at the first and second inputs, but the comparison is specifically perturbed by an offset voltage.

8. The sense amplifier according to claim 7, wherein the offset voltage is generated in said differential amplifier and corresponds to an offset voltage or acts as an offset voltage.

9. The sense amplifier according to claim 7, wherein the offset voltage is a variable voltage.

10. The sense amplifier according to claim 9, wherein the offset voltage is variable in one of a magnitude and an arithmetic sign thereof.

11. The sense amplifier according to claim 10, wherein one of the magnitude and arithmetic sign of the offset voltage is changed based on an output signal of said differential amplifier.

12. The sense amplifier according to claim 9, wherein an output signal of the differential amplifier indicates whether the voltage characterizing the content of the memory device is higher than a first threshold voltage or lower than a second threshold voltage, which is lower than the first threshold voltage.

13. The sense amplifier according to claim 12, wherein the first threshold voltage is higher than the reference voltage.

14. The sense amplifier according to claim 12, wherein the second threshold voltage is lower than the reference voltage.

15. The sense amplifier according to claim 12, wherein one of a difference between the first threshold voltage and the reference voltage and a difference between the second threshold voltage and the reference voltage is dependent on the offset voltage produced in the differential amplifier and corresponding to an offset voltage or acting as an offset voltage.

16. The sense amplifier according to claim 8, wherein the offset voltage is produced by impressing an additional current into the differential amplifier.

17. The sense amplifier according to claim 16, which comprises a current control stage outputting the additional current based on the output signal from the sense amplifier.

18. The sense amplifier according to claim 17, wherein said current control stage impresses the additional current at a point of said differential amplifier which is dependent on the output signal of the sense amplifier.

19. The sense amplifier according to claim 16, wherein the voltage produced in the differential amplifier and corresponding to an offset voltage or acting as an offset voltage is a voltage dropping across a resistance in said differential amplifier, with a flow of current through the resistance that produces the voltage drop dependent on the additional current impressed into said differential amplifier.

20. The sense amplifier according to claim 19, wherein a direction of the current flowing through the resistance is dependent on a point at which the current is impressed into said differential amplifier.

21. The sense amplifier according to claim 6, wherein one of the voltages supplied to said differential amplifier via said inputs is varied on a basis of the output signal of said differential amplifier.

22. The sense amplifier according to claim 6, wherein a supply voltage for said differential amplifier is varied on the basis of the output signal of said differential amplifier.

* * * * *